United States Patent
Le et al.

(10) Patent No.: US 9,602,116 B1
(45) Date of Patent: Mar. 21, 2017

(54) INTERLEAVED SUCCESSIVE APPROXIMATION REGISTER ANALOG TO DIGITAL CONVERTER

(71) Applicant: INPHI CORPORATION, Santa Clara, CA (US)

(72) Inventors: Michael Le, Santa Clara, CA (US); James Gorecki, Santa Clara, CA (US); Jamal Riani, Santa Clara, CA (US); Jorge Pernillo, Santa Clara, CA (US); Amber Tan, Santa Clara, CA (US); Karthik Gopalakrishnan, Santa Clara, CA (US); Belal Helal, Santa Clara, CA (US); Chang-Feng Loi, Santa Clara, CA (US); Irene Quek, Santa Clara, CA (US); Guojun Ren, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/990,309

(22) Filed: Jan. 7, 2016

(51) Int. Cl.
| | |
|---|---|
| *H03M 1/06* | (2006.01) |
| *H03L 7/10* | (2006.01) |
| *H03M 1/00* | (2006.01) |
| *H03M 1/12* | (2006.01) |
| *H03M 1/46* | (2006.01) |
| *H04L 25/03* | (2006.01) |

(52) U.S. Cl.
CPC ............ *H03M 1/0604* (2013.01); *H03L 7/10* (2013.01); *H03M 1/002* (2013.01); *H03M 1/121* (2013.01); *H03M 1/468* (2013.01); *H04L 25/03019* (2013.01)

(58) Field of Classification Search
CPC .... H03M 1/0604; H03M 1/468; H03M 1/121; H03M 1/002; H03L 7/10; H04L 25/03019
See application file for complete search history.

(56) References Cited

U.S. PATENT DOCUMENTS

| | | | | |
|---|---|---|---|---|
| 8,761,609 B1* | 6/2014 | Agazzi | ................. | H04B 10/616 398/155 |
| 9,337,934 B1* | 5/2016 | Agazzi | ................... | H04B 10/61 |
| 9,337,993 B1* | 5/2016 | Lugthart | ................. | H04L 7/033 |
| 9,455,848 B1* | 9/2016 | Zhang | ............... | H04L 25/03057 |
| 2002/0080898 A1* | 6/2002 | Agazzi | ................ | H03M 1/0624 375/355 |
| 2007/0133671 A1* | 6/2007 | Tsai | ....................... | H03H 11/26 375/233 |
| 2016/0072651 A1* | 3/2016 | Welch | .................... | H04B 10/00 375/286 |

* cited by examiner

*Primary Examiner* — Kenneth Lam
(74) *Attorney, Agent, or Firm* — Richard T. Ogawa; Ogawa P.C.

(57) ABSTRACT

In an example, the present invention provides an analog to digital converter device for a high speed data transmission from 1 GS-s to 100 GS-s, although there can be other variations. In an example, the device has an input receiver device coupled to a transimpedance amplifier. In an example, the transimpedance amplifier is coupled to an input stream of data at 10 GHz to 100 GHz, or other variations.

20 Claims, 6 Drawing Sheets

INTERLEAVED SUCCESSIVE APPROXIMATION REGISTER ANALOG TO DIGITAL CONVERTER

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to signal processing systems and methods thereof.

We live in an analog world, and communication media are analog. Computers and data communication operate in a digital world. To work with computers and data communication networks, constant conversions between analog and digital are a way of life. Speed, accuracy, and efficiency, are criteria on which conversion algorithms and systems are measured.

Over the past, various types of conversion systems and methods have been implemented. Unfortunately, conventional systems and methods have been inadequate, as explained below. Improved conversion systems and methods are desired.

SUMMARY OF INVENTION

The present invention is directed to signal processing systems and methods thereof. In various embodiments, the present invention provides an analog-to-digital conversion (ADC) device. There are other embodiments as well.

In an example, the present invention provides an analog to digital converter device for a high speed data transmission from 1 GS-s to 100 GS-s, although there can be other variations. In an example, the device has an input receiver device coupled to a transimpedance amplifier. In an example, the transimpedance amplifier is coupled to a input stream of data at 10 GHz to 100 GHz, or other variations. In an example, device has a continuous time linear equalizer device coupled to the input receiver device via an input. In an example, the continuous time linear equalizer device comprises the input and an output. In an example, the device has a plurality of buffer devices coupled to the output of the continuous time linear equalizer device. In an example, the device has a plurality of track and hold devices coupled to each of the buffer devices. The device has a sample and hold buffer devices coupled to each of the track and hold devices and a plurality of sub ADC device coupled to an output of each sample and hold buffer devices. In an example, the device a digital signal processing ("DSP) core coupled to each output of each of the plurality of sub ADC devices. In an example, the DSP comprises a plurality of feed forward equalizer devices. In an example, the plurality of feed forward equalizer devices are configured to provide an equalized output data stream to compensate for any mismatches among each of a plurality of data streams in each of the plurality of sub ADC devices, one or more of the mismatches being within 10 (ten) percent of each other or other variations. In an example, the device has a memory device coupled to each of the plurality of sub ADC device outputs, the memory device configured to an ADC test output port. In an example, the memory device comprising a plurality of SRAM cells or other high speed memory devices. In an example, the device has a PLL configured to generate a clock signal coupled to a clock generator. In an example, the clock generator provides a clock signal for each of the track and hold devices. In an example, the clock signal from the PLL ranging from 10 GHz to 50 GHz, although there can be variations. In an example, the device has a reference signal generated from the DSP core configured to control each of the sub ADC devices and is configured to control a delay element from each of the clock signals to each of the track and hold devices.

In an example, the continuous time linear equalizer device comprising a gain boosted amplifier device. In an example, each of the buffer devices is a unity gain buffer with feedback. In an example, each of the track and hold devices comprises a boosted PMOS switch device. In an example, the plurality of track and hold device is equal in quantity for each of the buffer devices or different in quantity for each of the buffer devices. In an example, each of the sample and gain buffers is a unity gain buffer. In an example, each of the sub ADC devices comprises a successive approximation register ADC. In an example, the device is characterized by an input frequency to signal to noise and distortion ratio between about 30 and 40 from about 10 MHz to 15 GHz. In an example, the device is configured within an interior region of a semiconductor substrate member, which comprises a plurality of CMOS cells. In an example, the device is coupled to an external connector comprising a bump structure, which is coupled to a package device. In an example, the bump structure is within 500 microns from an edge region of the device.

In an example, the present invention provides a method of operating an analog to digital converter device for a high speed data transmission from 1 GS-s to 100 GS-s, and other variations. The method includes transferring an input stream of data at 10 GHz to 100 GHz to an input receiver device coupled to a transimpedance amplifier, and processing the input stream using a continuous time linear equalizer device coupled to the input receiver device via an input. In an example, the continuous time linear equalizer device comprises the input and an output. In an example, the method includes transferring the processed signal to a plurality of buffer devices coupled to the output of the continuous time linear equalizer device. Each of the plurality of buffer devices is coupled to a plurality of track and hold devices. Each of the track and hold devices is coupled to a sample and hold buffer device. Each sample and hold buffer device is coupled to a plurality of sub ADC devices. In an example, the method includes transferring a data stream from each of the sub ADC devices to a digital signal processing ("DSP) core coupled to each output of each of the plurality of sub ADC devices. In an example, the DSP comprising a plurality of feed forward equalizer devices. In an example, the method includes processing, using the DSP core, using the plurality of feed forward equalizer devices to provide an equalized output data stream to compensate for any mismatches among each of a plurality of data streams in each of the plurality of sub ADC devices. In an example, one or more of the mismatches is within 10 (ten) percent of each other, although there may be variations. In an example, the method includes outputting the equalized output data stream and outputting an ADC test output signal from a memory device coupled to each of the plurality of sub ADC device outputs. In an example, the memory device is configured to output the ADC test output signal using an ADC test output port. In an example, the memory device comprises a plurality of SRAM cells. In an example, the method includes generating a first clock signal from a PLL configured to generate the first clock signal for input to a clock generator. The method includes generating a second clock signal, using the clock generator and the first clock signal, for each of the track and hold devices. In an example, the first clock signal generated from the PLL ranging from 10 GHz to 50 GHz, or other variations. In an example, the method includes generating a reference signal from the DSP core and controlling each of the sub ADC devices using the reference clock signal. The method includes controlling a delay element, using the reference clock signal, from each of the second clock signals to each of the track and hold devices.

DETAILED DESCRIPTION OF THE EXAMPLES

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1:
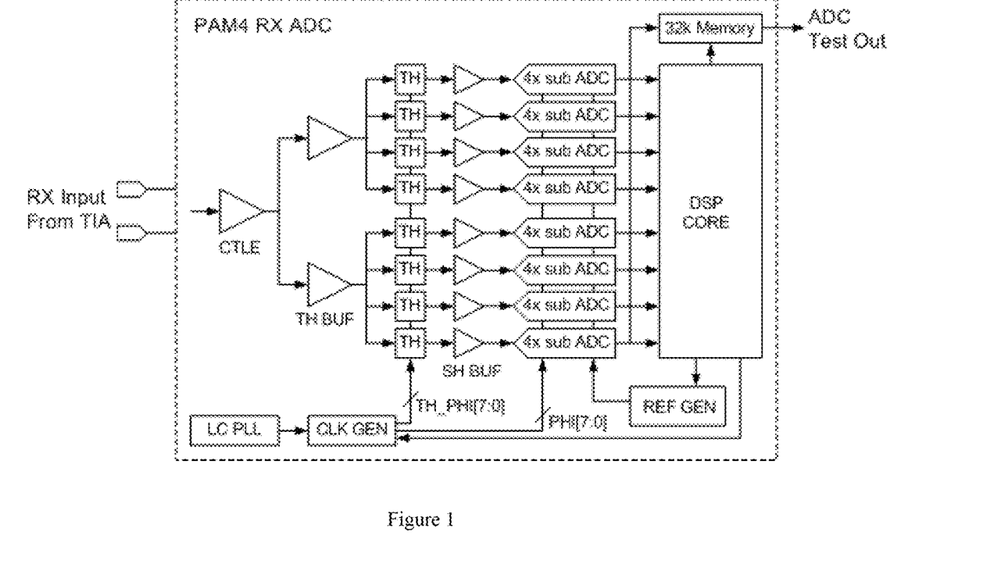
FIG. 1 is a simplified top level block diagram of the ADC based PAM receiver in an example.

ADC based receivers will become more prevalent with the adoption of PAM4 as the basis for next generation Ethernet based communication standards. Interleaved SAR ADC's have been shown to be a good choice in high-speed, moderate resolution applications [1-3]. FIG. 1 shows a top-level block diagram of an optical receiver using our ADC. The input signal from an external transimpedance amplifier (TIA) is first passed through a continuous-time linear equalizer (CTLE) with programmable gain and boost. The signal from the CTLE's first stage is buffered by a low-impedance second stage which drives four over-lapping track-and-hold (TAH) circuits. A unity gain buffer is used at the output of each TAH to drive four parallel sample-and-hold (SAH) circuits and their associated capacitor DAC's (CDAC's) comprising each sub-ADC. The reference voltages for each sub-ADC are independently adjustable and are generated by the REF GEN block. The digital output of each sub-ADC is feed into the DSP core. The DSP core contains a calibration engine that is used to estimate the gain, offset, bandwidth, and timing mismatches for each sub-ADC. The calibration engine compensates for gain and timing mismatch in the analog domain and offset in the digital domain. Residual gain, timing, offset, and bandwidth errors are compensated in the digital domain in conjunction with a fully adaptive feed-forward equalizer (FFE) inside the DSP core. The FFE and CTLE jointly provide channel equalization. An on-chip memory stores the ADC output bits which are then sent off chip serially at low speed.

Figure 2:
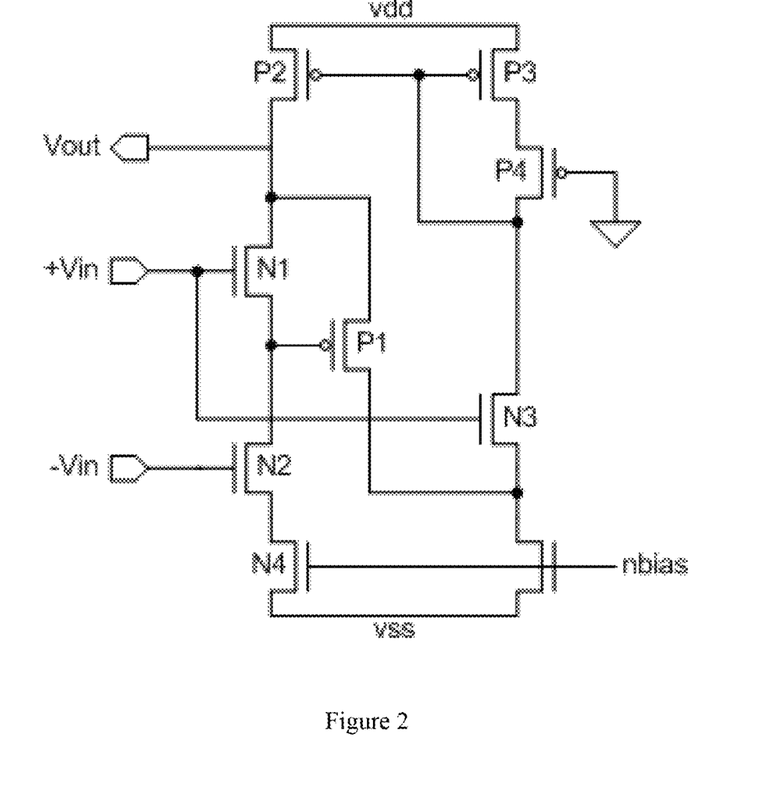
FIG. 2 is simplified schematic of the unity gain buffer with feedback in an example.

The ADC uses a two rank sampling network. The phases of the TAH circuits overlap such that two are always in track mode. Each TAH is connected to a unity gain buffer to drive the interleaved sub-ADC's. This buffer design reduces distortion due to gds modulation, TAH loading, and charge-redistribution induced gain errors while maintaining high linearity with a 950 mV supply by using a feed-forward based negative gds stage, cascaded source followers, and a class AB output stage. Unity gain over process variations is ensured by a replica circuit which controls the negative gds in the buffers. The unity gain buffer is shown in FIG. 2. Transistor P1 reduces the vds variation of N1 [4]; N3 performs a similar function for P1. Transistors N2 and N3 also create a negative gds to improve gain. THD at full scale is less than −45 dB at frequencies beyond Nyquist. Output drive is enhanced via the class AB stage created by P1, N3, and the mirror P2 and P3.

Figure 3:
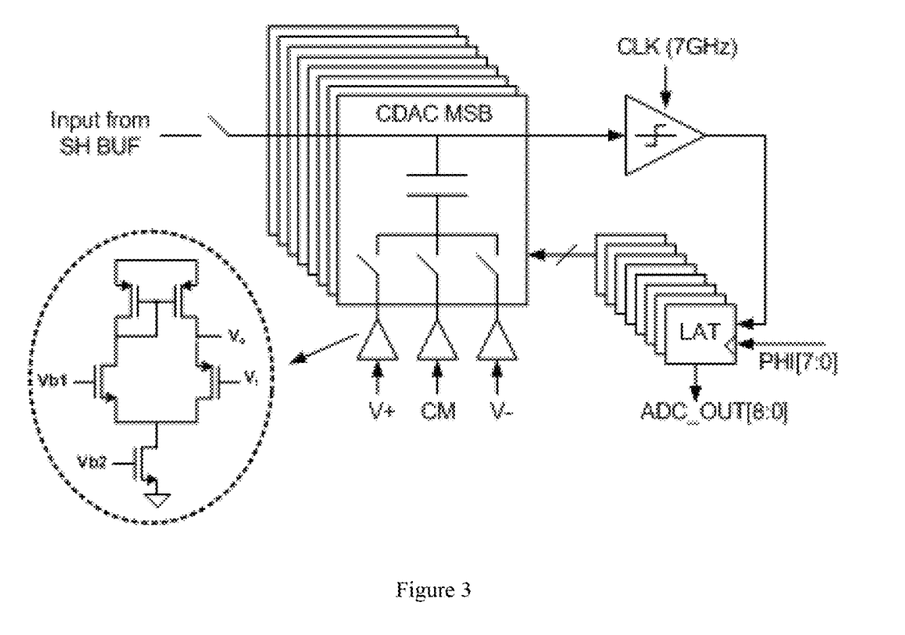
FIG. 3 is simplified block diagram of the SAR sub-ADC in an example.

Each of the 32 sub-ADC's consists of a SAH switch, CDAC, comparator, and latches which control the CDAC switches as shown in FIG. 3. A typical SAR ADC would require some additional logic that encodes the comparator output to control the appropriate switches in the CDAC [1-3]. Since this extra logic delay is in the feedback loop, the maximum operation speed is reduced. Here, the encoding delay is absorbed into the clock generation logic for our synchronous SAR ADC. PHI[7:0] are non-overlapping 12.5% duty cycle clocks that enable their respective latches during the appropriate conversion cycle. Each clock is shifted by 1T relative to the previous phase. Without the extra encoding logic, the loop delay is simply the clock-q delay of the comparator, propagation through the switch latch, and finally the reference buffer settling delay once the appropriate switch is selected. To alleviate the settling requirement on the reference buffers which saves power, redundancy is used on the first 4 MSB's in the CDAC [5]. Approximately 1 bit of resolution is sacrificed for the redundant codes. The remaining 4 LSB's are simply binary weighted. In previous SAR ADC's, the reference buffer is shared among the interleaved channels and a large capacitor is used to hold the reference voltage steady [3]. However, this gives a direct path for non-linear and signal dependent noise to couple between interleaved channels which degrades SNR. The capacitor needs to be large in order to keep the signal dependent noise small and this capacitor starts to be a dominant portion of the ADC area. Here, each sub-ADC uses it's own set of reference buffers to eliminate this noise source. The buffer uses active feedback to reduce the effective output impedance during transitions.

The AFE calibration logic inside the DSP core performs dc, gain, and timing offset estimation and correction resulting from mismatches between the different AFE paths. The gain of each interleaved channel is estimated using an envelope detector. These gain values are then compared to one channel that is used as a reference. Since each sub-ADC uses its own set of reference buffers, the gain mismatches of the interleaved channels can be compensated by adjusting its associated reference voltage. Residual gain errors can further be more precisely adjusted in the digital domain by the using the mean value estimate of the digital gain control loop. Offsets from the various analog signal paths and SAR comparators are estimated digitally by computing the average of the slicer error at the output of the FFE that corresponds to each signal path. The estimated offset is then subtracted digitally. Here, we sacrifice some dynamic range of the ADC for offset correction to avoid having to add DAC's in the analog signal path which degrades bandwidth. Timing mismatch is also estimated digitally by using correlated properties of the PAM input signal. The timing mismatch compensation loop controls delay cells inside the CLK GEN block which alters the sampling phase of the clocks TH PHI[7:0]. The granularity of each delay cell is about 100 fs. The DSP core employs a set of parallel FFE's for channel equalization. The parallel factor was optimized to be a multiple of the number of sub-ADC channels and to reduce power consumption. In this topology, bandwidth mismatches between the different AFE paths are compensated for by allowing each FFE slice to adapt independently.

Figure 4:
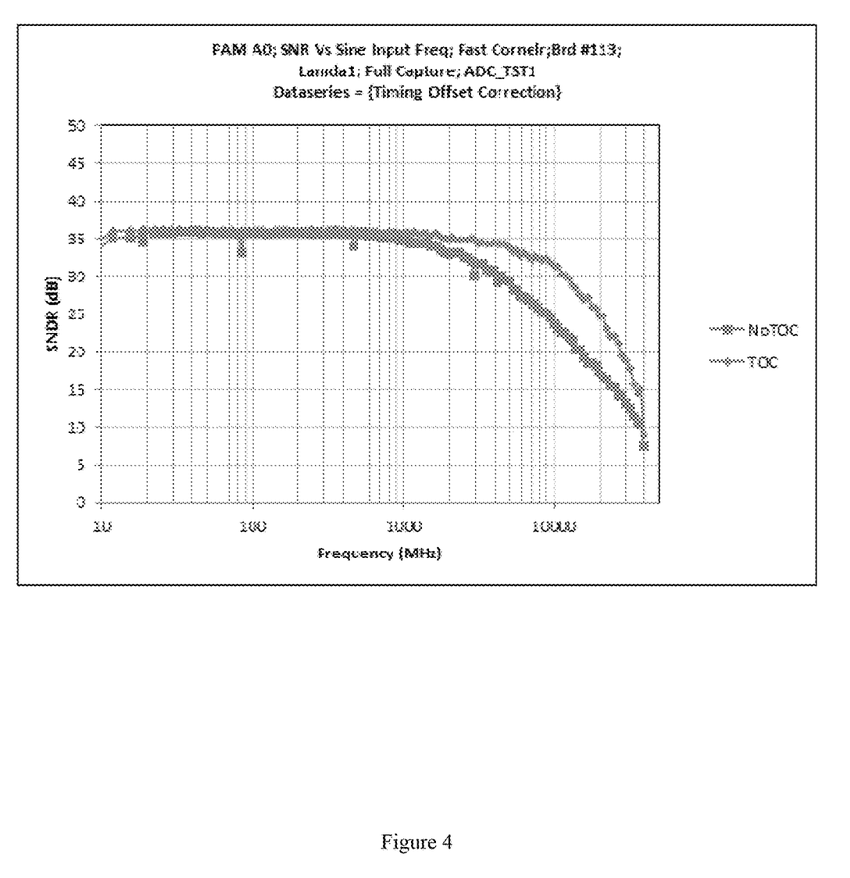
FIG. 4 is an illustration of measured SNR and THD versus input frequency in an example.
Figure 5A:
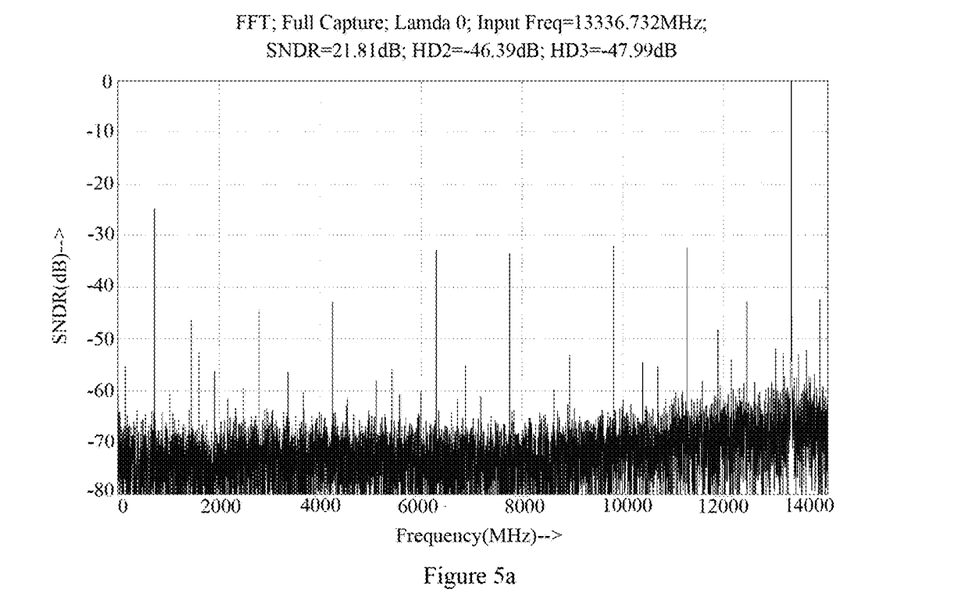
FIG. 5a is an illustration of FFT at 13.3 GHz without calibration enabled in an example.
Figure 5B:
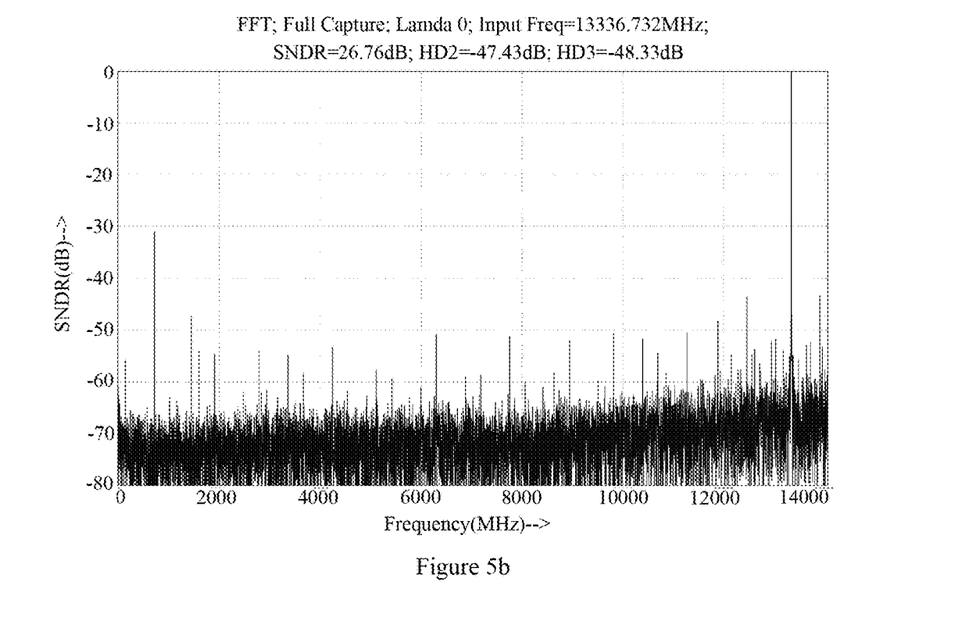
FIG. 5b is an illustration of FFT at 13.3 GHz with calibration enabled in an example.
Figure 6:
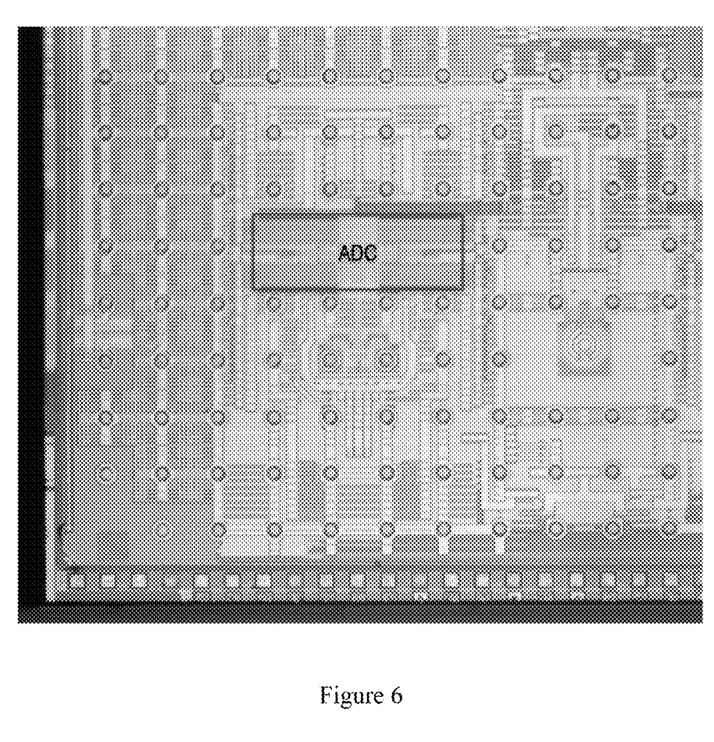
FIG. 6 is an illustration of a die photograph in an example.

The ADC is part of a complete PAM4 transceiver IC for optical and backplane applications. An on-chip LC-based PLL provides the clock for the ADC and its input is preceded by an on-chip CTLE, both of which limit the measured noise and THD performance of the ADC. For the ADC measurements, the FFE's in the DSP core were intentionally bypassed which disables the additional DSP-based bandwidth and fine timing mismatch calibration loops. However, the other calibration loops are still active. All measurements were conducted with the ADC loaded at approximately 95% of full scale to avoid clipping. FIG. 4 plots the SNR and THD of the ADC as a function of input frequency operating at 28 GS/s. The roll off at high frequency is mainly due to jitter from the on-chip PLL. At low frequency, the measured SNR is limited by noise from the analog front-end. FIGS. 5a and 5b show FFT's of the ADC with and without calibration enabled for an input tone close to Nyquist (13.3 GHz). Timing calibration improves the SFDR by more than 15 dB. At 13.3 GHz, the measured HD3 and HD2 is about −48 dBc and −46 dBc, respectively. The large HD2 component comes from imbalance at the chip inputs and second order distortion inherent in the CTLE input stage. The measured power of the ADC which includes all of the blocks shown in FIG. 1 excluding the LC PLL and CTLE is 150 mW from a single 950 mV power supply. FIG. 6 shows the die photograph of the ADC. It is implemented in a 28 nm CMOS process and occupies 0.2 mm$^2$ excluding the DSP core and capture memory. A comparison with other GS/s ADC's is shown in Table 1.

REFERENCES

[1] Yuri Greshishchev, et al., "A 40 GS/s 6b ADC in 65 nm CMOS", *ISSCC Dig. Tech. Papers*, pp. 390-391, February 2010.
[2] Lukas Kull, et. al., "A 90 GS/s 8b 667 mW 64× Interleaved SAR ADC in 32 nm Digital SOI CMOS", *ISSCC Dig. Tech. Papers*, pp. 378-379, February 2014.
[3] Yida Duan and Elad Alon, "A 6b 46 GS/s ADC with >23 GHz BW and Sparkle-Code Error Correction", *VLSI Symposium on Circuits*, June 2015.
[4] Simon Louwsma, et. al., "A Time-Interleaved Track-and-Hold in 0.13 um CMOS sub-sampling a 4 GHz Signal with 43 dB SNDR", *IEEE 2007 Custom Integrated Circuits Conference*, pp. 329.
[5] T. C. Verster, "A Method to Increase the Accuracy of Fast Serial-Parallel Analog-to-Digital Converters," *IEEE Trans. On Electronic Computers*, vol. EC-13, no. 4, pp. 471-473, August 1964.

While the above is a full description of the specific embodiments, various modifications, alternative constructions and equivalents may be used. Therefore, the above description and illustrations should not be taken as limiting the scope of the present invention which is defined by the appended claims.

TABLE 1

Comparison table.

|  | [1] | [2] | [3] | This work |
|---|---|---|---|---|
| fs (Gs/s) | 40 | 70 | 46 | 28* |
| SNDR (dB) | 25 | 34 | 25 | 36** |
| SFDR HD3 (dB) | −35 @ 18 GHz | −41 @ 19.9 GHz | −36 @ 5.5 GHz | −47 @ 13.3 GHz |
| Power (mW) | 1500 | 355 | 381 | 150 |
| Supplies (V) | 1, 1.2, 2.5 | 1.0, 1.2 | 1.05, 1.6 | 0.95 |
| FOM HF (pJ/c-s) | 2.5 @ 0.45 fs | 0.12 @ 0.28 fs*** | 0.56 @ 0.49 fs | 0.15 @ 0.48 fs |

*on-chip LC PLL limited maximum operating frequency
**limited by noise from the analog front-end and PLL
***much lower than Nyquist frequency

The invention claimed is:
1. An analog to digital converter (ADC) device for a high speed data transmission from 1 GS-s to 100 GS-s, the device comprising:
an input receiver device coupled to a transimpedance amplifier, the transimpedance amplifier being coupled to a input stream of data at 10 GHz to 100 GHz;

a continuous time linear equalizer device coupled to the input receiver device via an input, the continuous time linear equalizer device comprising the input and an output;

a plurality of buffer devices coupled to the output of the continuous time linear equalizer device;

a plurality of track and hold devices coupled to each of the buffer devices;

a sample and hold buffer device coupled to each of the track and hold devices;

a plurality of sub ADC devices coupled to an output of each sample and hold buffer device;

a digital signal processing (DSP) core coupled to each output of each of the plurality of sub ADC devices, the DSP comprising a plurality of feed forward equalizer devices, the plurality of feed forward equalizer devices configured to provide an equalized output data stream to compensate for any mismatches among each of a plurality of data streams in each of the plurality of sub ADC devices, one or more of the mismatches being within 10 (ten) percent of each other;

a memory device coupled to each of the plurality of sub ADC device outputs, the memory device configured to an ADC test output port, the memory device comprising a plurality of SRAM cells;

a Phase Lock Loop (PLL) configured to generate a clock signal coupled to a clock generator, the clock generator providing a clock signal for each of the track and hold devices, the clock signal from the PLL ranging from 10 GHz to 50 GHz;

a reference signal generated from the DSP core configured to control each of the sub ADC devices and configured to control a delay element from each of the clock signals to each of the track and hold devices.

2. The device of claim 1 wherein the continuous time linear equalizer device comprising a gain boosted amplifier device.

3. The device of claim 1 wherein each of the buffer devices is a unity gain buffer with feedback.

4. The device of claim 1 wherein each of the track and hold devices comprises a boosted PMOS switch device.

5. The device of claim 1 wherein the plurality of track and hold device is equal in quantity for each of the buffer devices or different in quantity for each of the buffer devices.

6. The device of claim 1 wherein each of the sample and gain buffers is a unity gain buffer.

7. The device of claim 1 wherein each of the sub ADC devices comprises a successive approximation register ADC.

8. The device of claim 1 wherein the device is characterized by an input frequency to signal to noise and distortion ratio between about 30 and 40 from about 10 MHz to 15 GHz.

9. The device of claim 1 wherein the device is configured within an interior region of a semiconductor substrate member, the semiconductor member comprising a plurality of CMOS cells.

10. The device of claim 1 wherein the device is coupled to an external connector comprising a bump structure, the bump structure is coupled to a package device, the bump structure is within 500 microns from an edge region of the device.

11. A method of operating a analog to digital converter (ADC) device for a high speed data transmission from 1 GS-s to 100 GS-s, the method comprising:

transferring an input stream of data at 10 GHz to 100 GHz to an input receiver device coupled to a transimpedance amplifier;

processing the input stream using a continuous time linear equalizer device coupled to the input receiver device via an input, the continuous time linear equalizer device comprising the input and an output;

transferring the processed signal to a plurality of buffer devices coupled to the output of the continuous time linear equalizer device, each of the plurality of buffer devices coupled to a plurality of track and hold devices, each of the track and hold devices being coupled to a sample and hold buffer device, each sample and hold buffer device coupled to a plurality of sub ADC devices;

transferring a data stream from each of the sub ADC devices to a digital signal processing (DSP) core coupled to each output of each of the plurality of sub ADC devices, the DSP comprising a plurality of feed forward equalizer devices;

processing, using the DSP core, using the plurality of feed forward equalizer devices to provide an equalized output data stream to compensate for any mismatches among each of a plurality of data streams in each of the plurality of sub ADC devices, one or more of the mismatches being within 10 (ten) percent of each other;

outputting the equalized output data stream;

outputting an ADC test output signal from a memory device coupled to each of the plurality of sub ADC device outputs, the memory device configured to output the ADC test output signal using an ADC test output port, the memory device comprising a plurality of SRAM cells;

generating a first clock signal from a Phase Lock Loop (PLL) configured to generate the first clock signal for input to a clock generator;

generating a second clock signal, using the clock generator and the first clock signal, for each of the track and hold devices, the first clock signal from the PLL ranging from 10 GHz to 50 GHz;

generating a reference signal from the DSP core;

controlling each of the sub ADC devices using the reference clock signal;

controlling a delay element, using the reference clock signal, from each of the second clock signals to each of the track and hold devices.

12. The method of claim 11 wherein the continuous time linear equalizer device comprising a gain boosted amplifier device.

13. The method of claim 11 wherein each of the buffer devices is a unity gain buffer with feedback.

14. The method of claim 11 wherein each of the track and hold devices comprises a boosted PMOS switch device.

15. The method of claim 11 wherein the plurality of track and hold device is equal in quantity for each of the buffer devices or different in quantity for each of the buffer devices.

16. The method of claim 11 wherein each of the sample and gain buffers is a unity gain buffer.

17. The method of claim 11 wherein each of the sub ADC devices comprises a successive approximation register ADC.

18. The method of claim 11 wherein the device is characterized by an input frequency to signal to noise and distortion ratio between about 30 and 40 from about 10 MHz to 15 GHz.

19. The method of claim 11 wherein the device is configured within an interior region of a semiconductor substrate member, the semiconductor member comprising a plurality of CMOS cells.

20. The method of claim 11 wherein the device is coupled to an external connector comprising a bump structure, the bump structure is coupled to a package device, the bump structure is within 500 microns from an edge region of the device.

* * * * *